(12) United States Patent
Krishnamurthy et al.

(10) Patent No.: US 11,448,711 B2
(45) Date of Patent: Sep. 20, 2022

(54) SIMULATION MODELS FOR INTEGRATED FLUXGATE MAGNETIC SENSORS AND OTHER MAGNETIC CIRCUIT COMPONENTS

(71) Applicant: Texas Instruments Incorporated, Dallas, TX (US)

(72) Inventors: Vijay Krishnamurthy, Santa Clara, CA (US); Tikno Harjono, Cupertino, CA (US); Viola Schaffer, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1258 days.

(21) Appl. No.: 14/667,756

(22) Filed: Mar. 25, 2015

(65) Prior Publication Data

US 2016/0282421 A1    Sep. 29, 2016

(51) Int. Cl.
  *G06F 17/10*  (2006.01)
  *G01R 33/00*  (2006.01)
  *G06F 30/367*  (2020.01)

(52) U.S. Cl.
  CPC ..... *G01R 33/0023* (2013.01); *G01R 33/0064* (2013.01); *G06F 30/367* (2020.01)

(58) Field of Classification Search
  CPC .................................................. G06F 17/5036
  USPC .......................................................... 703/2
  See application file for complete search history.

(56) References Cited

U.S. PATENT DOCUMENTS

| | | | |
|---|---|---|---|
| 3,571,700 A | 3/1971 | Paine et al. | |
| 4,667,414 A | 5/1987 | Russell | |
| 6,278,272 B1 | 8/2001 | Scarzello et al. | |
| 6,577,992 B1 | 6/2003 | Tcherniaev et al. | |
| 7,298,141 B2 | 11/2007 | Bartington | |
| 7,391,210 B2 | 6/2008 | Zhang et al. | |
| 7,391,211 B2 | 6/2008 | Cripe | |
| 8,301,431 B2 | 10/2012 | Heragu et al. | |
| 8,306,804 B2 | 11/2012 | Boselli et al. | |
| 8,312,399 B2 | 11/2012 | Fang et al. | |
| 8,339,133 B2 | 12/2012 | Teppan | |
| 9,217,763 B2 * | 12/2015 | Teppan | G01R 19/20 |
| 2003/0178993 A1 * | 9/2003 | Tang | G01R 33/04 324/253 |

(Continued)

OTHER PUBLICATIONS

Simulation of Magnetic Component Models in Electric Circuits Including Dynamic Thermal Effects (11 pages) (Year: 2002).*

(Continued)

*Primary Examiner* — Andre Pierre Louis

(74) *Attorney, Agent, or Firm* — Andrew R. Ralston; Charles A. Brill; Frank D. Cimino

(57) ABSTRACT

Improved magnetic component models, circuit simulation systems and methods are presented for simulating operation of a modeled magnetic circuit component in which user input defines magnetically susceptible core geometry of the modeled magnetic circuit component, a core model simulates operation of the magnetically susceptible core at least partially according to the geometry of the magnetically susceptible core, and one or more coil models simulate operation of coils wound around the magnetically susceptible core to provide a scalable model with geometry adjustable permeability for fluxgate magnetic sensors, transformers, inductors or other modeled components.

9 Claims, 14 Drawing Sheets

(56) References Cited

U.S. PATENT DOCUMENTS

| | | | |
|---|---|---|---|
| 2006/0132118 A1* | 6/2006 | Maekawa | G01R 29/0814 324/96 |
| 2013/0049749 A1 | 2/2013 | Mohan et al. | |
| 2013/0099334 A1 | 4/2013 | Mohan et al. | |
| 2014/0022033 A1* | 1/2014 | Yang | H01H 71/32 335/170 |
| 2014/0184214 A1 | 7/2014 | Schaffer et al. | |
| 2014/0218018 A1 | 8/2014 | Ivanov et al. | |
| 2014/0244223 A1 | 8/2014 | Fang | |
| 2014/0285189 A1 | 9/2014 | Kashmiri et al. | |
| 2015/0042325 A1 | 2/2015 | Snoeij et al. | |
| 2015/0048818 A1 | 2/2015 | Schaffer et al. | |
| 2015/0048820 A1 | 2/2015 | Schaffer et al. | |

OTHER PUBLICATIONS

Nogueira (Calculation of Power Transformers Equivalent Circuit Parameters Using Numerical Field Solutions, 8 pages). (Year: 2013).*

Bazzocchi, et al. "Interference rejection algorithm for current measurement using magnetic sensor arrays", Sensors and Actuators 85 (2000), pp. 38-41.

Dezuari, et al. "Printed circuit board integrated fluxgate sensor", Sensors and Actuators 81 (2000), pp. 200-203.

Tang, et al. "Excitation circuit for fluxgate sensor using saturable inductor", Sensors and Actuators A 113 (2004), pp. 156-165.

Ripka, et al. "Pulse Excitation of Micro-Fluxgate Sensors", IEEE Transactions on Magnetics, vol. 37, No. 4, Jul. 2001, pp. 1998-2000.

Drljaca, et al., "Low-Power 2-D Fully Integrated CMOS Fluxgate Magnetometer", IEEE Sensors Journal, vol. 5, No. 5, Oct. 2005, pp. 909-915.

Choi et al., "The Microfluxgate Magnetic Sensor Having Closed Magnetic Path", IEEE Sensors Journal, vol. 4, No. 6, Dec. 2004, pp. 768-771.

Jiles, et al., "Theory of Ferromagnetic Hysteresis: Determination of Model Parameters from Experimental Hysteresis Loops", IEEE Trans. on Magnetics, vol. 25, No. 5, Sep. 1989, pp. 3928-3930.

Williams, et al., "Simulation and Modeling of Nonlinear Magnetics", The Designer's Guide Community, downloaded from www.designers-guide.org, Copyright 2012, Kenneth S. Kundert, pp. 1-12.

Wilson, et al., "Modeling Frequency-Dependent Losses in Ferrite Cores", IEEE Trans. on Magnetics, vol. 40, No. 3, May 2004, pp. 1537-1541.

Maier, "CMOS Circuits For Magnetic Microsensors Based On Simple Sensor Models", thesis written at Physical Electronics Laboratory, ETH Zurich, Switzerland; Chapter 4: Integrated Microfluxgate System, 2000, 50 pgs.

Williams, et al., "Simulation and Modeling of Nonlinear Magnetics", IEEE, 1995, pp. 736-739.

* cited by examiner

104 ↙

510 ↙

EQUATIONS

(12) $\text{if}(h < oldh\ \&\&\ state == inc) \begin{cases} htp = oldh\ |\ mtp = oldm \\ state = dec \\ m = G(mtp, mtm, F(htp + HC), F(htm + HC)) \\ b = mtp - m * F(htp + HC) \\ oldh = h \\ oldm = F(h) \end{cases}$

(13) $\text{if}(h > oldh\ \&\&\ state == dec) \begin{cases} htm = oldh\ |\ mtm = oldm \\ state = inc \\ m = G(mtp, mtm, F(htp - HC), F(htm - HC)) \\ b = mtp - m * F(htp - HC) \\ oldh = h \\ oldm = F(h) \end{cases}$

(14) $\text{if}(h < htm\ \&\&\ state == dec) \begin{cases} htm = -hsat\ |\ mtm = -BSAT/\mu_0 \\ m = G(mtp, mtm, F(htp + HC), F(htm + HC)) \\ b = mtp - m * F(htp + HC) \end{cases}$

(15) $\text{if}(h > htm\ \&\&\ state == inc) \begin{cases} htp = hsat\ |\ mtp = BSAT/\mu_0 \\ m = G(mtp, mtm, F(htp - HC), F(htm - HC)) \\ b = mtp - m * F(htp - HC) \end{cases}$

(16) $\text{if}(h > oldh\ \&\&\ state == inc)\{oldh = h\ |\ oldm = F(h)\}$

(17) $\text{if}(h < oldh\ \&\&\ state == dec)\{oldh = h\ |\ oldm = F(h)\}$

(18) $\text{if}(state == inc)\{mags = m * F(h - HC) + b$

(19) $\text{if}(state == dec)\{mags = m * F(h + HC) + b$

(20) $magd == \dfrac{OMEGAN}{DAMPFAC} * \dfrac{\left(s + \dfrac{OMEGAN}{DAMPFAC}\right)}{\left(s^2 + \dfrac{OMEGAN}{DAMPFAC} * s + OMEGAN^2\right)} * mags$

(21) $PHI = B * area == \mu_0 * magd * area$

FIG. 6B

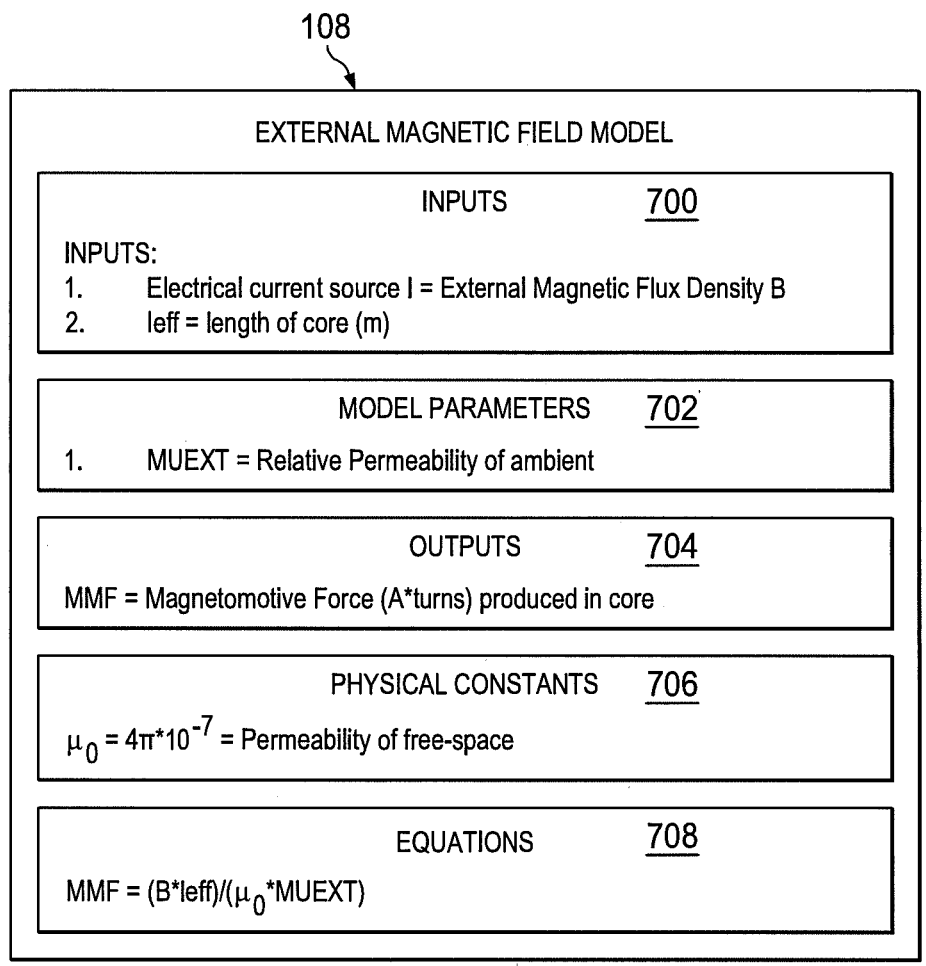
FIG. 7
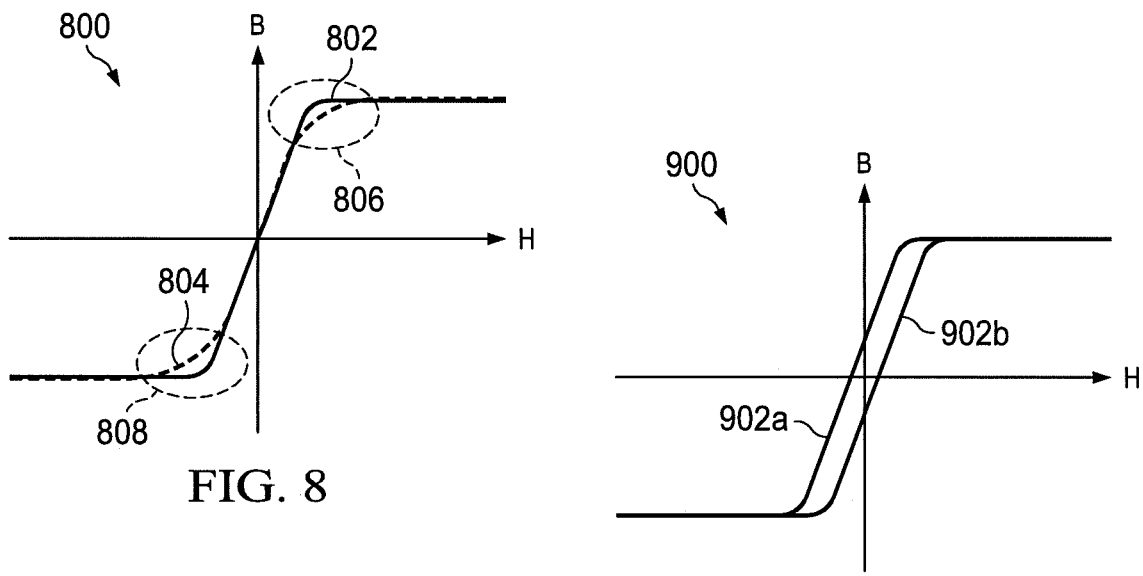
FIG. 8
FIG. 9

SIMULATION MODELS FOR INTEGRATED FLUXGATE MAGNETIC SENSORS AND OTHER MAGNETIC CIRCUIT COMPONENTS

REFERENCE TO RELATED APPLICATIONS

The following US application is referenced: U.S. patent application Ser. No. 14/050,910, filed Oct. 10, 2013 and entitled HEART PULSE MONITOR INCLUDING A FLUXGATE SENSOR.

FIELD OF THE INVENTION

The present disclosure relates to magnetic circuit components and more particularly to improved models, systems and methods for simulating fluxgate magnetic sensors and other magnetic circuit components.

BACKGROUND

Computer-based circuit simulators allow evaluation of circuit performance before an actual circuit is built, thereby saving time and expense, and facilitating timely, cost-effective circuit design adjustment and development. A circuit simulator is a software application or program that analyzes a circuit design to predict its behavior under a given set of conditions or assumptions, using a circuit description including component models and equations describing the desired behavior of the circuit. The simulator application solves the equations based on simulated circuit conditions, such as voltages and currents represented by stimuli applied to the circuit in order to simulate operation under those conditions. Components of the simulated circuit are represented by device models including mathematical descriptions including equations, with the simulated circuit comprising interconnection of modeled devices. The device models may be provided in the circuit simulator (e.g., device models of SPICE-like simulators), and/or may be specified by a user using a hardware description language (e.g., Verilog-AMS, Verilog-A), and the models are typically made available to circuit designers as a part of a process design kit (PDK).

Electric and electronic circuits often include one or more forms of magnetic circuit components, such as transformers, chokes, inductors, etc to provide isolation, inductance and other functions in a circuit. These circuit components typically include a magnetically susceptible core such as a ferromagnetic core, and one or more coils for interconnection to other components of a circuit. Magnetic components may also be used as sensors, such as fluxgate sensors for sensing external magnetic fields in current sensors, digital magnetometers (electronic compasses), non-contacting positions sensors, and other sensor applications. Fluxgate sensors are high sensitivity magnetic field sensors operated by driving an excitation winding or coil and sensing an output voltage from a sense winding or coil that is proportional to or otherwise representative of an external field. Fluxgate sensors and other magnetic circuit components operate according to a magnetic flux density versus magnetic field characteristic curve (referred to as a B-H curve) of the magnetically susceptible material used as the sensor core. The slope of the B-H curve in a linear region represents the effective permeability of the magnetically susceptible core, and the flux saturates at a critical magnetic field level where all magnetic domains in the core are aligned in the same direction. This non-linear B-H characteristic is an important operational parameter of a fluxgate sensor. Conventional simulation models for fluxgate sensors, however, do not accurately represent the B-H curve, do not emulate geometry scalability and its effect on the effective linear region core permeability, and typically suffer from lack of convergence during co-simulation with surrounding circuitry. Accordingly, a need remains for improved circuit simulation systems and methods as well as models for magnetic circuit components.

SUMMARY

The present disclosure provides user adjustable magnetic component models and circuit simulation systems and methods in which a magnetic circuit component is modeled according to one or more model user inputs with a configurable parameter or parameters defining at least one geometry aspect of a magnetically susceptible core of the modeled circuit component, as well as one or more core models to simulate operation of the magnetically susceptible core at least partially according to the core geometry, and at least one coil model to simulate operation of a coil wound at least partially around the magnetically susceptible core. The present disclosure further provides improved core characterization to more accurately simulate the B-H curve characteristics including transitions from the linear slope to the saturation region, hysteresis, and scalability. In certain embodiments, the magnetic component model further includes an external magnetic field model component to represent external magnetic fields in order to facilitate accurate convergent simulation of fluxgate and other magnetic sensor circuit component operation.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which:

FIGS. 6A and 6B are schematic diagrams illustrating magnetically susceptible core model equations in the core model of FIG. 5;

FIG. 7 is a schematic diagram illustrating an external magnetic field model in the fluxgate sensor component simulation model of FIG. 1;

FIG. 8 is a graph illustrating a B-H curve simulated by the magnetically susceptible core model of FIGS. 5-6B providing improved fit in the transition region between the linear slope and saturation regions;

FIG. 9 is a graph illustrating a B-H curve simulated by the magnetically susceptible core model of FIGS. 5-6B including hysteresis;

DETAILED DESCRIPTION

Figure 1:
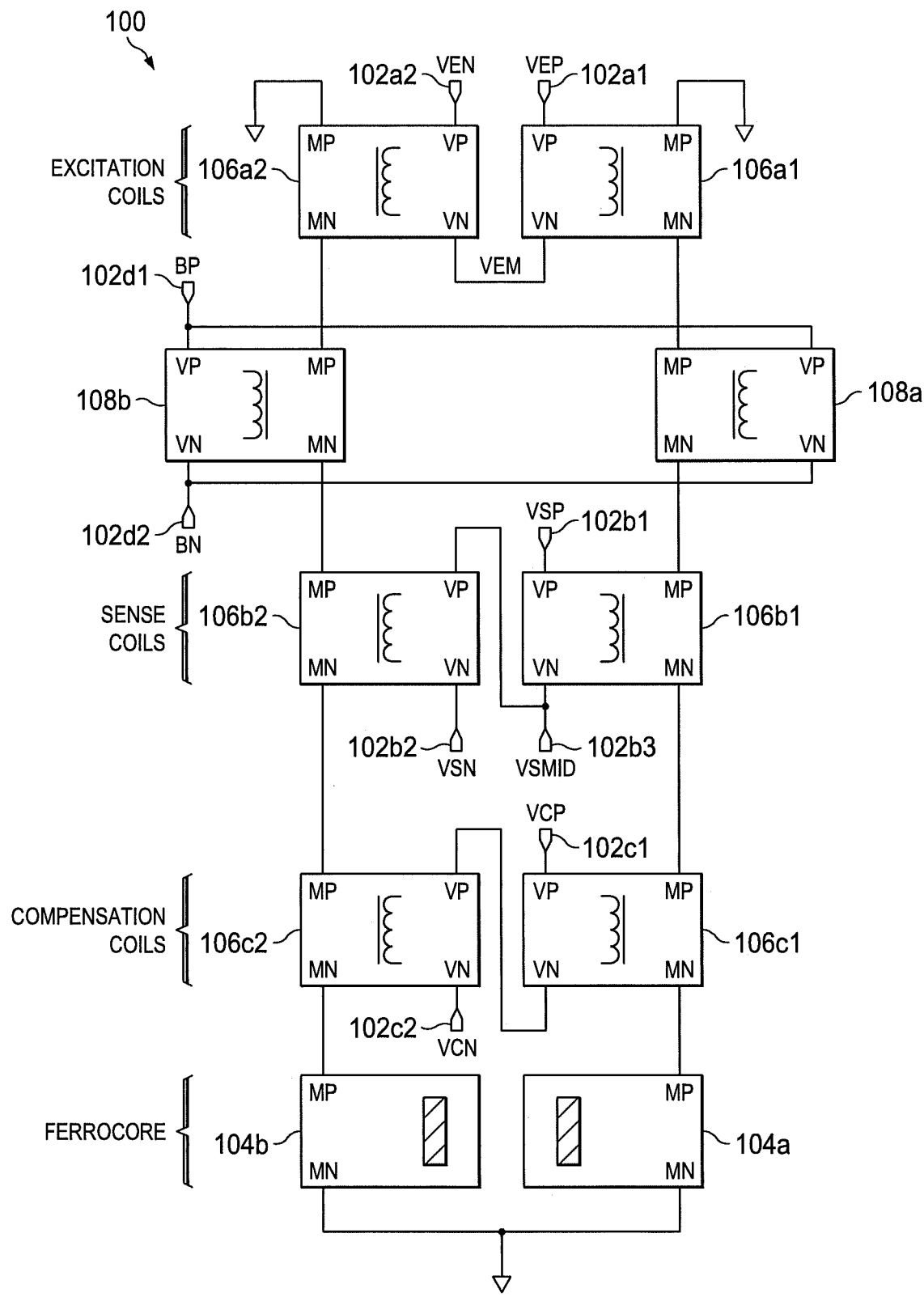
FIG. 1 is a schematic diagram illustrating a user adjustable differential fluxgate magnetic sensor component simulation model including a core model and several coil models interconnected to form parallel magnetic circuits for simulating operation of a fluxgate magnetic sensor.

One or more embodiments or implementations are hereinafter described in conjunction with the drawings, wherein like reference numerals are used to refer to like elements throughout, and wherein the various features are not necessarily drawn to scale. The present disclosure provides magnetic component models, circuit simulation systems and methods used for simulating operation of a modeled magnetic circuit component. The model allows a user to define and adjust the magnetically susceptible core geometry and simulates operation of the magnetically susceptible core based at least partially on the geometry of the magnetically susceptible core to provide a scalable model with improved accuracy, transition region modeling, hysteresis, inductance vs. current modeling and geometry adjustable permeability for fluxgate magnetic sensors, transformers, inductors and/or other modeled magnetic components.

Figure 2:
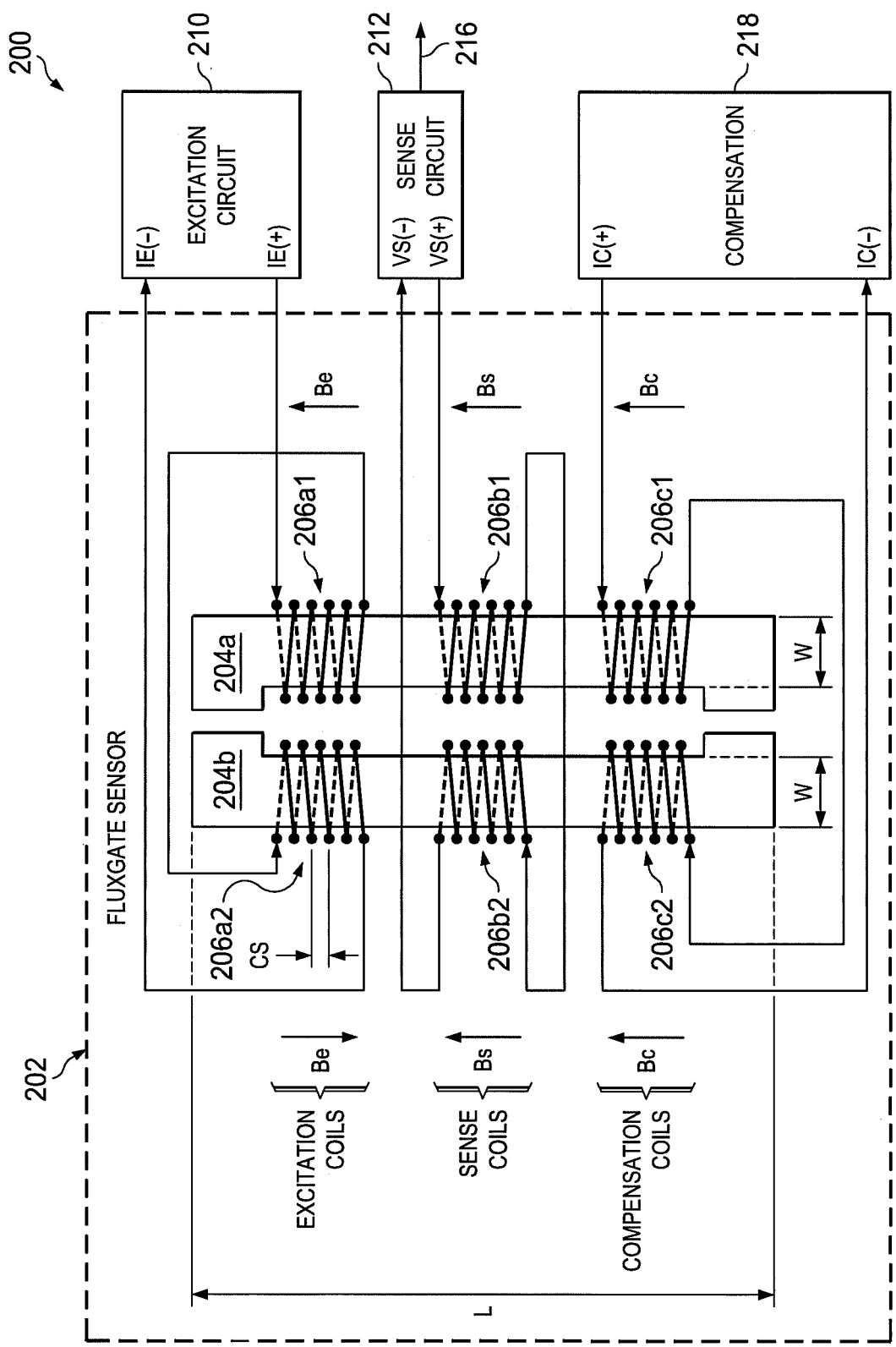
FIG. 2 is a schematic diagram illustrating a differential fluxgate magnetic sensor simulated by the model of FIG. 1, shown connected with excitation, sensing and compensation circuit components.

Referring initially to FIGS. 1 and 2, FIG. 1 schematically illustrates a user adjustable differential fluxgate magnetic sensor component simulation model 100 including various connection inputs 102 for connection by a user to other simulated component elements, along with first and second core models 104a and 104b and several coil models 106a1, 106a2, 106b1, 106b2, 106c1 and 106c2, and external magnetic field models 108a and 108b interconnected to form two parallel magnetic circuits for operational simulation of a fluxgate magnetic sensor 202 shown in the simulated circuit 200 of FIG. 2.

As seen in FIG. 2, the fluxgate sensor 202 is operatively connected with external excitation, sensing and compensation circuit components 210, 212 and 214, respectively, with the sense circuit 212 providing an output signal or value 216 representing an external magnetic field proximate the sensor 202. In this example, the sensor 202 is a differential architecture with first and second ferromagnetic or otherwise magnetically susceptible core portions 204a and 204b modeled in FIG. 1 by corresponding first and second core models 104a and 104b, respectively. Although illustrated as including a core 204 with two gaps formed by the two core portions 204a and 204b, other ferromagnetic core can be modeled using at least one core model 104 of the user adjustable magnetic component model 100. In this example, moreover, the magnetically susceptible core structure 204 includes two longitudinally opposite gaps separating bilaterally symmetrical core portions 204a and 204b, although other designs are possible in which no gap is used, or a single gap may be provided, or more than two such gaps may be included in the core structure 204 that may be of any suitable shape, and the core portions 204a and 204b may, but need not be symmetrical in all embodiments.

The fluxgate sensor embodiment 202 in FIG. 2 includes a pair of excitation windings or coils 206a1 and 206a2 respectively wound in constructive or additive orientations around the core portions 204a and 204b, and are coupled with positive and negative excitation circuit outputs IE(+) and IE(−) of the excitation circuit 210 for conducting excitation current such that the resulting excitation magnetic flux contributions (shown in FIG. 2 as the arrows labeled "Be") generated by the coils 206a1 and 206a2 are additive. The excitation coils 206a1 and 206a2 in FIG. 2 are respectively modeled by excitation coil models 106a1 and 106a2 in the magnetic component model 100 of FIG. 1, with the connection for a simulated excitation circuit being provided via predetermined positive and negative excitation connection inputs 102a1 (VEP) and 102a2 (VEN) of the model 100. The excitation coil models 106a in certain embodiments are stored in an electronic memory (e.g., 306 in FIG. 3 below) and are executable a processor (e.g., 302 below) in order to simulate operation of an excitation coil 206a wound at least partially around the magnetically susceptible core 204 of the modeled magnetic circuit component 202 at least partially according to a simulated circuit connection to a simulated excitation circuit 210.

The fluxgate sensor 202 of FIG. 2 also includes first and second sense coils 206b1 and 206b2 wound respectively around the first and second core portions 204a and 204b, and these are connected with one another and with voltage sense inputs VS(+) and VS(−) of the sense circuit 212 in opposing fashion such that the resulting core flux contributions are in opposing directions (arrows "Bs" and FIG. 2). The fluxgate sense coils 206b1 and 206b2 in FIG. 2 are modeled via the sense coil models 106b1 and 106b2 of FIG. 1, with the fluxgate sensor model 100 also providing predetermined positive, negative and midpoint sensed voltage connection inputs 102b1 (VSP), 102b2 (VSN) and 102b3 (VSMID), respectively. The sense coil model(s) 106b is or are also stored in an electronic memory for execution by a processor to simulate operation of a sense coil or coils 206b wound at least partially around the core 204 based on simulated circuit connection to a simulated sense circuit 212.

The excitation circuit 210 in FIG. 2 provides an AC excitation signal to the excitation coils 206a, such as a sinusoidal signal, pulse signal, etc. The sensing circuitry 212, in turn, receives a sensor coil signal via the inputs VS(+) and VS(−), and provides at least one output signal or value 216, such as a voltage signal in one example, based at least partially on the sensor signals received from the sense coils 206b. In operation, the AC excitation alternately drives the core structure 204 through magnetic saturation and demagnetization in opposite polarities or directions, thereby inducing an electrical sense current flow in the sensing coils 206b. The illustrated fluxgate sensor 202 senses an external magnetic field generally in the vertical direction in FIG. 2, with the sense circuit 212 including suitable demodulation circuitry to provide the output signal or value 216 representing the magnitude of the external magnetic field proximate the sensor 202. Specifically, when the core structure 204 is exposed to an external magnetic field (e.g., vertically upward in the orientation shown in FIG. 2), the core structure 204 is more easily saturated in alignment with that external field, and less easily saturated in opposition to the external field. Consequently, the induced sense coil current will be out of phase with the excitation current, and the difference will be related to the strength of the vertical external magnetic field. In one possible implementation, the sense circuit 212 includes an integrator or synchronous demodulator circuit (not shown) providing an analog output voltage signal 216 proportional to the sensed magnetic field along the corresponding sensing direction of the fluxgate magnetic sensor 202. Moreover, the sense circuit 210 in certain embodiments is synchronized with the operation of the excitation circuit 210.

Compensation coils 206c1 and 206c2 are also provided in the example fluxgate sensor 202 of FIG. 2, each wound around a corresponding core portion 204a, 204b and connected in opposing fashion to generate opposing fluxes indicated by arrows "Bc" in the drawing. The coils 206c1 and 206c2 are connected with one another and with a compensation circuit 218 via compensation current connections IC(+) and IC(−) thereof. As seen in FIG. 1, the compensation coils are simulated using coil models 106c1 and 106c2 interconnected with one another and with predetermined compensation coil connection inputs 102c1 (VCP) and 102c2 (VCN) for simulating connection to simulated compensation circuitry. In certain embodiments (e.g., FIGS. 13 and 14 below) a fluxgate sensor 202 and a corresponding fluxgate sensor model 100 may be implemented without the compensation coils and corresponding compensation coil models. When used, the compensation coil model 106c is stored in memory and is processor-executable to simulate operation of a compensation coil 206c wound at least partially around the core 204 based at least partially on connection to a simulated compensation circuit 218.

As seen in FIG. 2, the excitation, sense and any included compensation coils or windings 206 in one embodiment may be formed around the corresponding portions 204a and 204b of the core structure using conductive portions on different layers of a substrate assembly, with solid lines in FIG. 2 showing winding portions above the corresponding core structure 204 and dashed-lines showing winding portions below the corresponding core structure 204. Other embodiments are possible, for example, in which the windings or coils 206 are constructed using wires or combinations of wires and circuit board traces, etc. The coil models 106 in FIG. 1 simulate magnetic behavior in conjunction with the core models 104 by providing electric domain simulation connections VEP and VEN as well as magnetic domain connections MP and MN, thus allowing electric domain connection to one another and/or to other simulated circuit components and connections via the set of predefined connection inputs 102 in a simulation system, with the magnetic domain connections MP and MN allowing interconnection of various model components (coil models 106, core models 104 and any included external magnetic field model components 108 described below) to form one or magnetic circuits as part of the simulation of the adjustable magnetic component model 100. In certain embodiments, moreover, the model 100 may include further predetermined connection inputs 102 (not shown), for example to provide connection to other simulated circuit components for an excitation midpoint (VEM in FIG. 1), and the illustrated embodiment provides a connection input 102b3 for simulation interconnection of a sense circuit midpoint in the electrical domain representing the interconnection of the first and second sense coil models 106b1 and 106b2.

If used, the magnetic field model 108 is stored in the electronic memory 306 and is executable by the processor to simulate operation of an external magnetic field proximate the magnetically susceptible core 204 of the modeled fluxgate sensor component 202. The user adjustable differential fluxgate sensor model 100 also provides first and second magnetic field models 108a and 108b in FIG. 1 for processor-executed simulation of the effects of an external magnetic field proximate the magnetically susceptible core 204 in FIG. 2. In other non-sensing magnetic component models 100 (e.g., the transformer of FIGS. 17 and 18, the inductor coil of FIGS. 19 and 20 below), external magnetic field effects need not be modeled, and hence the magnetic field models 108 may be omitted in certain embodiments. In the case of a differential fluxgate sensor model 100, however, the external field models 108a and 108b provide positive and negative electric domain connections VP and VN connected with electric domain connection inputs 102d1 and 102d2 to receive electric domain simulation signals used for simulating application or presence of magnetic flux near the fluxgate sensor being simulated (e.g., BP and BN in FIG. 1). In this manner, a simulation may provide a current source or voltage source in a simulated design for applying a signal translated by the magnetic field models 108 into the magnetic domain for interconnection with the magnetic domain connections of the coil models 106 and the core models 104. With respect to simulating sensor components, as well as other magnetic components subjected in actual use to external magnetic fields, the magnetic field models 108 provide another parameter allowing users to tailor device performance simulation to more accurately represent device performance in real-world applications.

Figure 14:
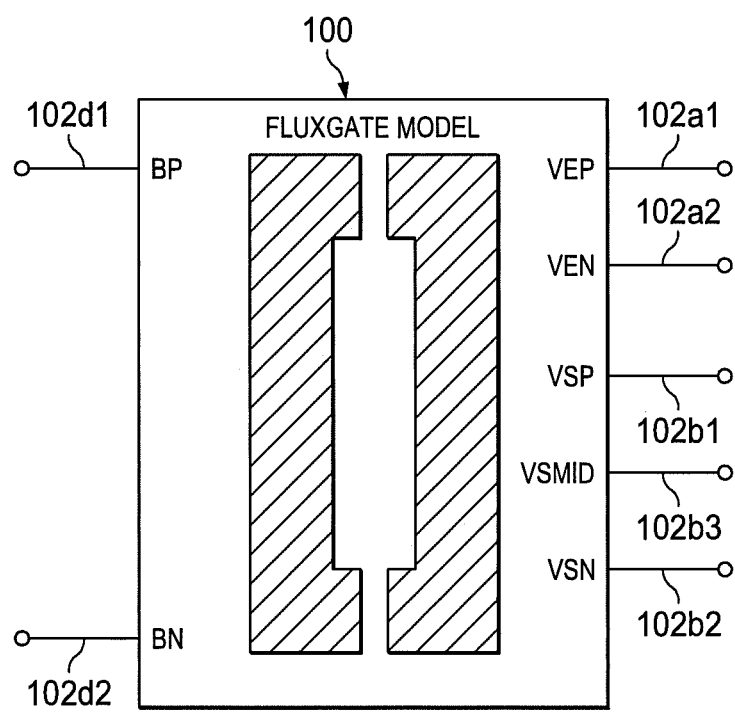
FIG. 14 is a schematic diagram illustrating a user interface rendering of the fluxgate sensor simulation model of FIG. 13.
Figure 13:
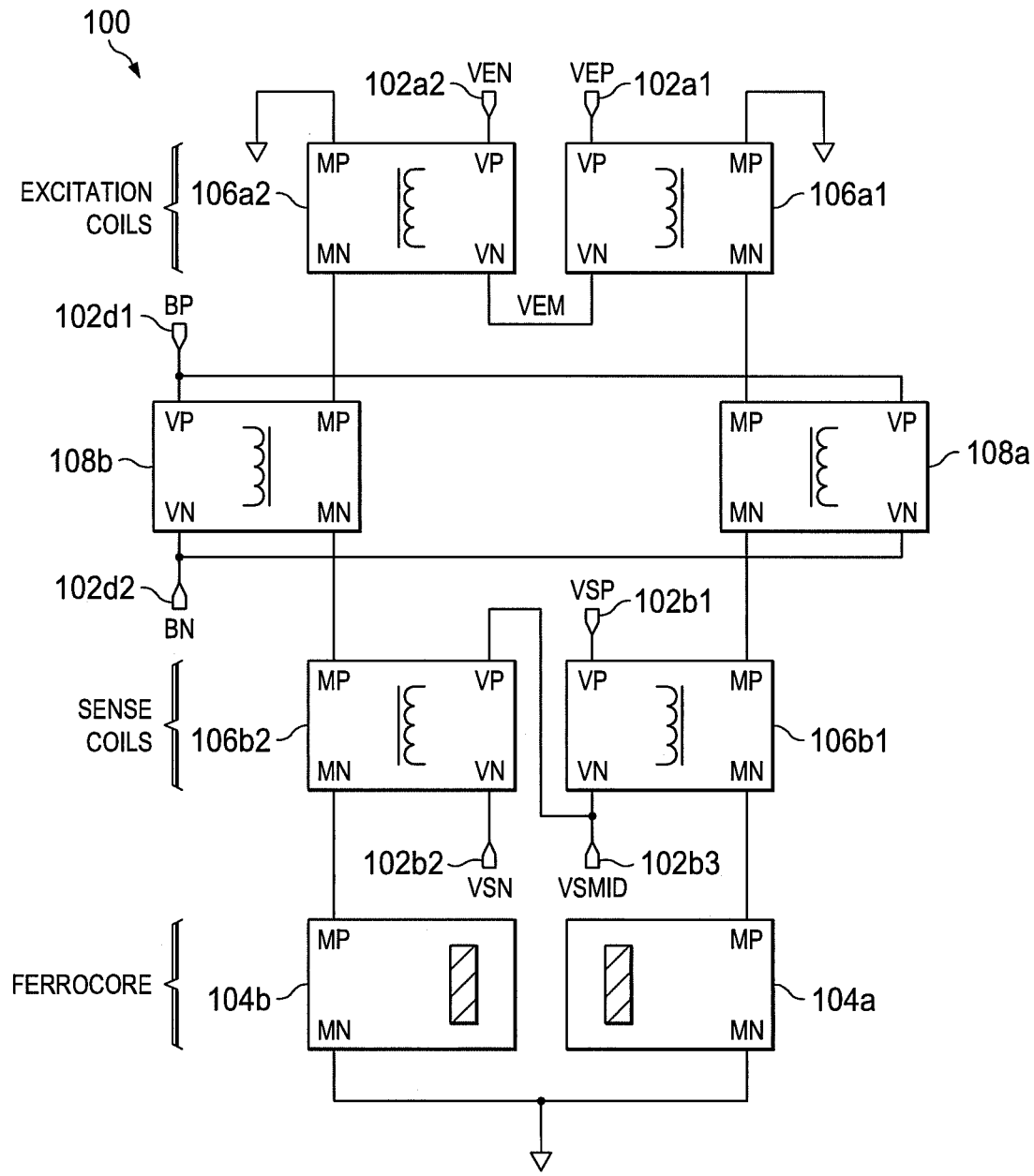
FIG. 13 is a schematic diagram illustrating another differential fluxgate magnetic sensor component simulation model without compensation coils.

In certain embodiments, one or more optional models, such as compensation coil models 106c and external magnetic field models 108 can be included in a given magnetic component model 100, and interconnected with one or more other coil models 106 and/or core models 104 and/or connection inputs 102, where a user may choose to provide no connections to the corresponding connection inputs 102 (or with such input connections 110 to a fixed simulation ground connection or other static value), such that the simulation system provides a simulation as if no corresponding compensation coil(s) 206c are included in the simulated device 202 and/or as if no corresponding external magnetic field is present in the circuit being simulated. In other embodiments, such as shown in FIGS. 13 and 14 below, the model 100 may be constructed without such compensation coil models 106c, and/or without any external field model 108 (e.g., FIGS. 17-20 below).

As further seen in FIG. 2, moreover, the core structure 204 of the fluxgate sensor 202 includes one or more geometric aspects, including without limitation a core length L and core width W shown in the drawing as well as a thickness, which may be characterized as a single area aspect, and which may be represented in a simulation system as one or more values by the core model(s) 104. As illustrated and described further below in connection with FIG. 3, the illustrated model 100 provides one or more user inputs and equations 320 allowing automated computation of the core length L based on user input of the number of coils for the excitation, sense and any included compensation coils for a given design, as well as a coil width or spacing parameter (e.g., CS in FIG. 2). In this regard, any number of excitation and sense windings may be used in different coil embodiments, as well as any number of windings for any included compensation coils. In addition, the coil windings in different embodiments can take on many different variations with respect to winding configurations relative to a given core configuration 204.

The inventors have appreciated that the geometric aspects of the simulated magnetic component, in this case a fluxgate sensor 202, influence the magnetic and hence electrical domain behavior or performance of the simulated device. As further described below, moreover, the magnetic component model 100 is user adjustable by way of one or more model user inputs and/or equations 320 (FIG. 3 below) including at least one user configurable parameter defining one or more geometric aspects of the magnetically susceptible core 204. In this manner, the model 100 advantageously facilitates simulation of a variety of different user-specified core geometries and designs, with the core model 104 providing improved simulation accuracy with respect to a variety of performance characteristics. For instance, the illustrated embodiments facilitate improved B-H curve modeling including accurate simulation of geometry-specific effective permeability $\mu_{eff}$ representing the slope of the linear portion of the B-H curve for the modeled magnetically susceptible core 204, improved accuracy in simulating the transition regions between the linear slope and saturation portions of the B-H curve at least partially according to one or more user defined geometric aspects of the magnetically susceptible core, B-H curve hysteresis, and more accurate inductance versus current (L-I) modeling than was possible using conventional fixed geometry magnetic component models. As a result, use of the disclosed user adjustable magnetic component models 100 facilitate convergence of simulation system operations and more accurate simulation results.

Referring again to FIG. 1, the differential fluxgate magnetic sensor model 100 is configured with two parallel magnetic domain circuits, each formed by series interconnection of a core model 104 with two or more coil models 106 and a magnetic field model 108. This is accomplished in the schematic illustration of the model 100 by interconnecting the magnetic domain positive and negative connections MP and MN as illustrated, wherein any suitable series connection of the models 104, 106 and 108 can be used. In the illustrated example, a series magnetic circuit is established by connection of the positive magnetic domain connection of the first excitation coil model 106a1 to a simulation circuit ground, and connection of the corresponding negative magnetic domain connection MN to the positive connection MP of the first magnetic field model 108a. The negative magnetic domain connection MN of the magnetic field model 108a is connected to the positive connection MP of the sense coil model 106b1, whose negative magnetic domain connection MN is connected to the positive connection MP of the included compensation coil model 106c1. The compensation coil model 106c1 has its negative magnetic domain connection MN connected to the positive connection MP of the magnetically susceptible core model 104a, whose negative connection MN is connected to the simulation circuit ground. The second magnetic domain series circuit is similarly configured by magnetic domain connection of the excitation coil model 106a2, the magnetic field model 108b, the sense coil model 106b2, the compensation coil model 106c2 and the second core model 104b as shown in FIG. 1.

Figure 15:
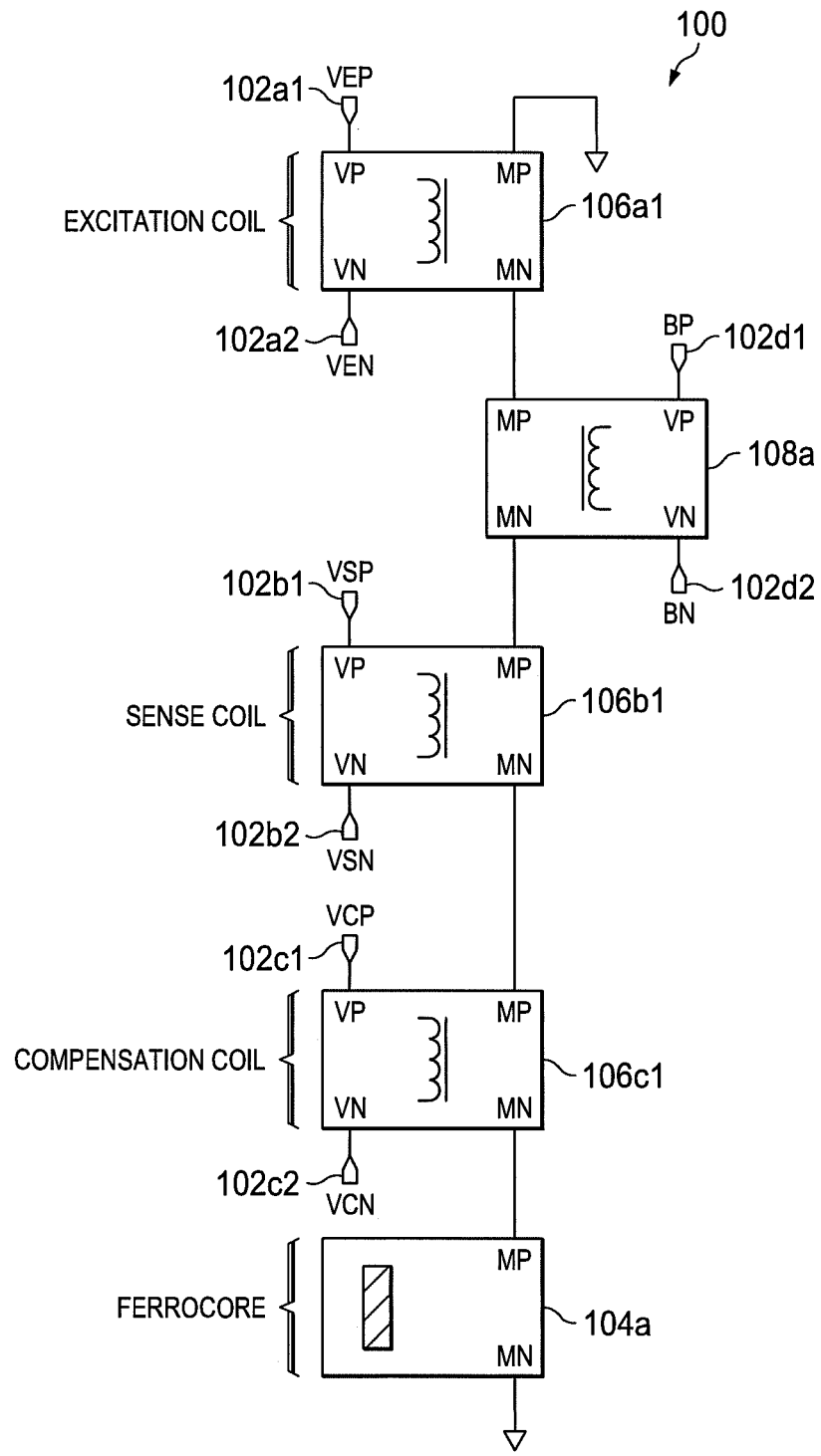
FIG. 15 is a schematic diagram illustrating a single ended fluxgate magnetic sensor component simulation model.

As previously mentioned, moreover, the electrical domain model connections VP and VN for the coil and external magnetic field models 106 and 108 are interconnected with one another and with certain of the predetermined connection inputs 102 as shown in FIG. 1 in order to emulate the coil interconnections of the modeled fluxgate sensor 202 of FIG. 2. As seen and described further below in connection with FIGS. 13-20, moreover, different interconnections of the connection inputs 102, core models 104, coil models 106 and any included external magnetic field models 108 in the simulated electrical domain and the simulated magnetic domain can be used to model a variety of different magnetic component model configurations. For example, FIG. 13 illustrates a differential fluxgate sensor model 100 with no compensation coils, FIG. 15 illustrates an example of a single ended fluxgate sensor model 100 with a compensation coil model 106c1, FIG. 17 illustrates an example transformer component model 100 with primary and secondary coil models 106 and a magnetic core model 104a, and FIG. 19 shows a magnetic component model 104 for simulating an inductor coil. It is further noted that while the transformer and inductor coil models of FIGS. 17 and 19 in these examples do not include external magnetic field models 108, such external field models 108 can be included in device models 100 for transformers, inductors, chokes, or other modeled magnetic components, for example, to allow simulation of the effects of magnetic field proximate the modeled device.

Figure 3:
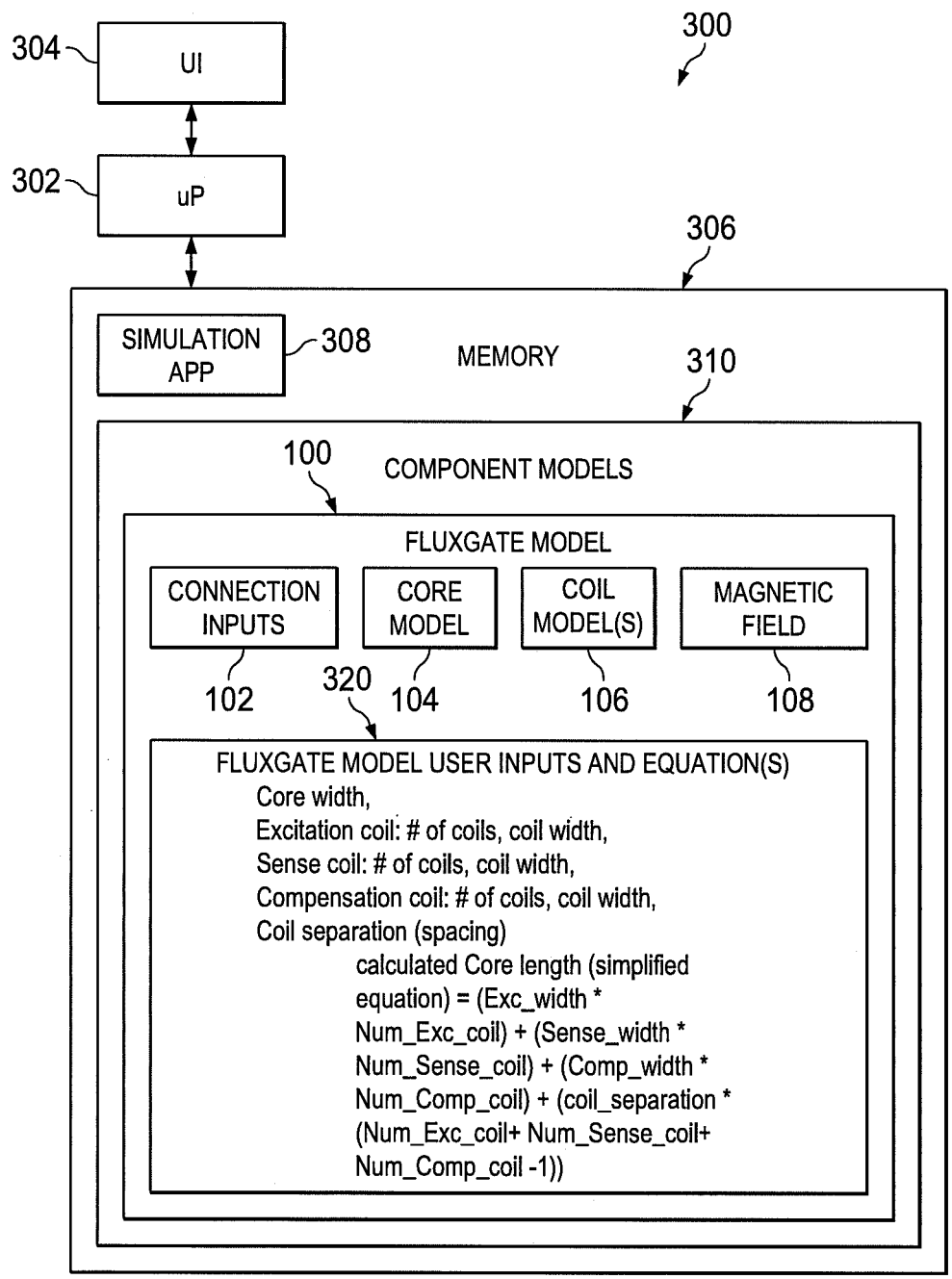
FIG. 3 is a schematic diagram illustrating a circuit simulation system to simulate operation of a modeled electric circuit including a fluxgate sensor component simulation model.
Figure 4:
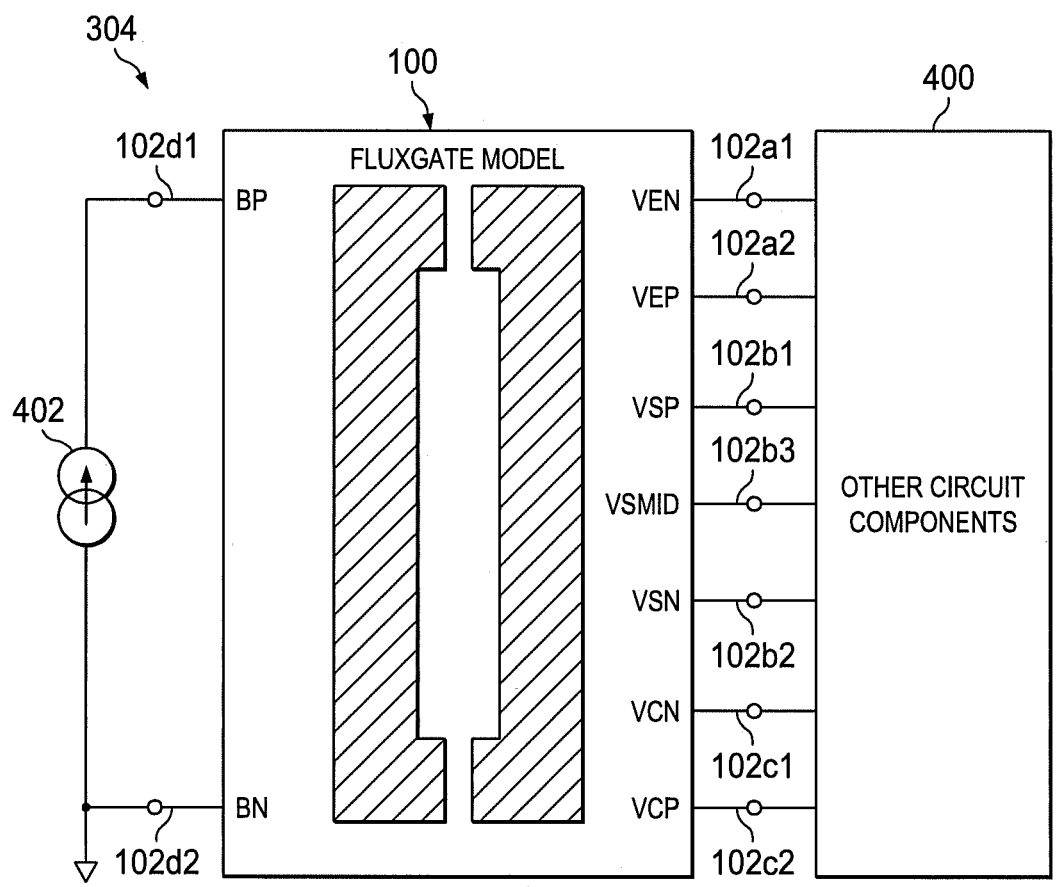
FIG. 4 is a schematic diagram illustrating a simulation system user interface display showing interconnection of the differential fluxgate magnetic sensor component simulation model in a simulated electric circuit.

Referring now to FIGS. 3 and 4, FIG. 3 shows a circuit simulation system 300 to simulate operation of a modeled electric circuit including a fluxgate sensor component simulation model 100 as shown in FIG. 1. The simulation system 300 includes one or more processors 302, a user interface 304 and an electronic memory 306 storing computer executable instructions for implementing a simulation application 308 as well as a component model library 310 with one or component models including a user adjustable magnetic component model 100. In the following description, the system operation is set forth in the context of the above-described differential fluxgate sensor model 100, although the system 300 can be used in connection with one or more different magnetic component models 100 (e.g., the sensor models 100 of FIGS. 13 and 15, the transformer model of FIG. 17, the inductor coil model of FIG. 19). The simulator application 308 may be any suitable circuit simulator application, such as a SPICE simulator implemented using one or more processors 302, which stores simulation results in the memory 306. In one embodiment, the simulation system 300 uses a display of the interface 304 to visually provide the simulation results to a user in any suitable form, for example, including waveform graphs as a function of time, etc., and the interface 304 can allow a user to define a simulated circuit and enter user configurable parameters of the model 100. Moreover, the simulator application 308 may employ various numerical methods and techniques, some of which may be iterative, including without limitation Monte Carlo analysis techniques and the like by which a variety of circuit operating conditions can be simulated to provide statistical results.

As shown in FIG. 3, the magnetic component model 100 is stored in the memory 306 and includes data, parameters, equations, and instructions executable by the processor 302 to simulate operation of a modeled magnetic circuit component 202 in a modeled electrical circuit 200 (FIG. 2) defined by user interconnection of a plurality of circuit component models 310. Moreover, the illustrated fluxgate model 100 includes one or more model user inputs 320 including one or configurable parameters defining the geometry (e.g., L, W, area, etc.) of the magnetically susceptible core 204. In this example, the inputs 320 allow the user to specify the core width W (FIG. 2), as well as the number of coils (Num_Exc_coil, Num_Sense_coil, Num_Comp_coil) and coil width values (Exc_width, Sense_width, Comp_width) for the excitation coil(s) 206a, the sense coil (s) 206b and any included compensation coil(s) 206c, along with a coil separation or spacing value (coil_separation, shown as CS in FIG. 2 above). With this information, the illustrated fluxgate model 100 calculates the core length value (L in FIG. 2) as L=(Exc_width*Num_Exc_coil)+(Sense_width*Num_Sense_coil)+(Comp_width*Num_Comp_coil)+(coil_separation*(Num_Exc_coil+Num_Sense_coil+Num_Comp_coil−1)), and can thus ascertain the core area to be modeled at least partially according to the user defined geometry aspect(s) of the magnetically susceptible core 204. Other suitable formulations and user inputs can be used in different embodiments by which the user can tailor or set one or more aspects of the core geometry.

FIG. 4 shows a simulation system user interface display rendering 304 illustrating interconnection of the differential fluxgate magnetic sensor component simulation model 100 in a simulated electric circuit along with other circuit components 400 and 402. As seen in FIG. 4, the user has connected a current source 402 to the electric domain BP and BN connection inputs 102d1 and 102d2 of the user interface rendering of the fluxgate model 100 to emulate an external magnetic field near the modeled sensor 202, and has connected the connection inputs for the excitation, sensing and compensation signal inputs to other circuit components 400. In this manner, the simulation of the operation of the connected current source 402 provides a signal input to the simulation model 100 to simulate the effects of an external magnetic field proximate the simulated fluxgate sensor 202, with the magnetic field component 108 and core model 104 (FIGS. 3 and 1) simulating operation of the modeled fluxgate sensor 202 accordingly.

In one possible operational example, the user interfaces with the processor 302 via the user interface 304 in FIG. 3 in order to place and interconnect a number of circuit components 100, 400, 402 in a graphically displayed simulation screen 304 shown in FIG. 4. The magnetic component model 100 provides a set of predetermined connection inputs 102 stored in the memory 306 (e.g., as seen in the example of FIG. 1 above) to define simulated circuit connections to the modeled magnetic circuit component 202, an example of which is shown in the user interface display rendering 304 of FIG. 4. In general, the magnetic component model 100 also includes one or more model user inputs 320 stored in the electronic memory 306, with at least one user configurable parameter defining at least one geometry aspect (e.g., L, W, CS) of the core 204, as well as at least one core model 104 stored in the electronic memory 306 for execution by the processor 302 to simulate operation of the core 204 of the modeled component 202 at least partially according to the geometry aspect(s). Also, the model 100 has at least one coil model 106 stored in the electronic memory 306 and executable by the processor 302 to simulate operation of the coil(s) wound at least partially around the core 204. In operation, the simulator application 308 is executed by the processor 302 to simulate operation of the modeled electric circuit 200 according to the defined simulation circuit (300 for in FIG. 4) at least partially according to the magnetic component model 100. In addition, where a sensor component is used, such as the fluxgate sensor 202 of FIG. 2, the core model 104 is executed by the processor 302 to simulate operation of the magnetically susceptible core 204 at least partially according to the simulated external magnetic field modeled by the magnetic field models 108.

Figure 5:
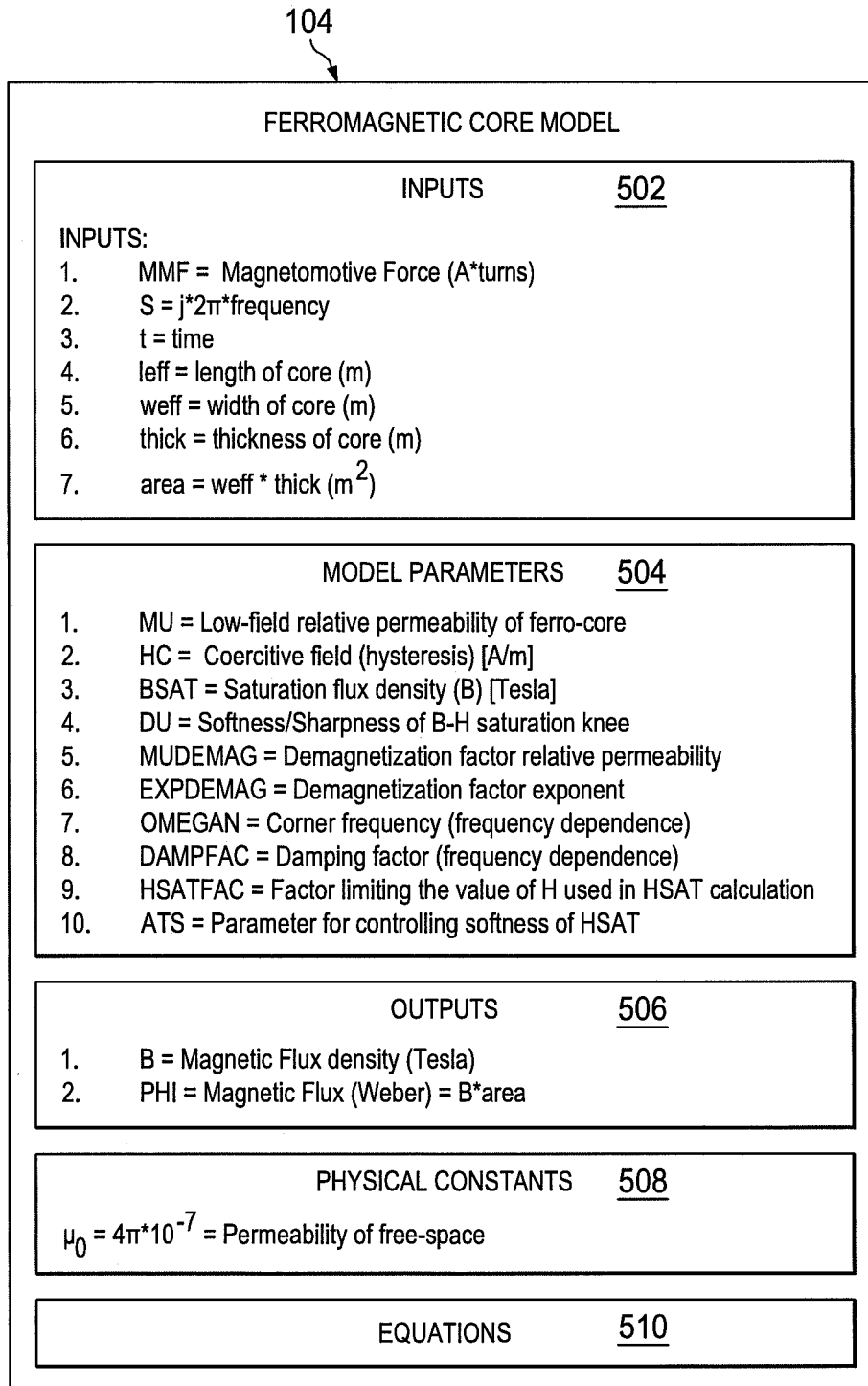
FIG. 5 is a schematic diagram illustrating a magnetically susceptible core model in the fluxgate sensor component simulation model of FIG. 1.

Referring also to FIGS. 5-7, FIG. 5 shows further details of an embodiment of a magnetically susceptible core model 104 in the fluxgate sensor component simulation model 100 of FIG. 1. The core model 104 of FIG. 5 includes inputs 502, as shown below:

MMF=Magnetomotive Force (A*turns)
s=j*2π*frequency
t=time
leff=length of core (m)
weff=width of core (m)
thick=thickness of core (m)
area=weff*thick (m$^2$)

As seen above, the illustrated magnetic core model embodiment 104 provides inputs 502 relating to MMF, temporal and frequency based inputs, and geometric inputs (core length, width, thickness and a computed area as shown in FIG. 5). In addition, the core model 104 includes parameters 504 as shown below:

Model Parameters:
MU=Low-field relative permeability of ferro-core
HC=Coercitive field (hysteresis) [A/m]
BSAT=Saturation flux density (B) [Tesla]
DU=Softness/Sharpness of B-H saturation knee
MUDEMAG=Demagnetization factor relative permeability
EXPDEMAG=Demagnetization factor exponent
OMEGAN=Corner frequency (frequency dependence)
DAMPFAC=Damping factor (frequency dependence)
HSATFAC=Factor limiting the value of H used in HSAT calculation
ATS=Parameter for controlling softness of HSAT
Outputs:
B=Magnetic Flux density (Tesla)
PHI=Magnetic Flux (Weber)=B*area
Physical Constants: $\mu_0$=4π*10$^{-7}$=Permeability of free-space As seen above, the parameters in this embodiment include one or more demagnetization parameters and factors related to hysteresis of the core 204. The core model 104 also includes a permeability physical constraint 508 and one or more equations 510, and solves one or more of these to provide outputs 506 including a magnetic flux density value and a total magnetic flux value.

Figure 6A:
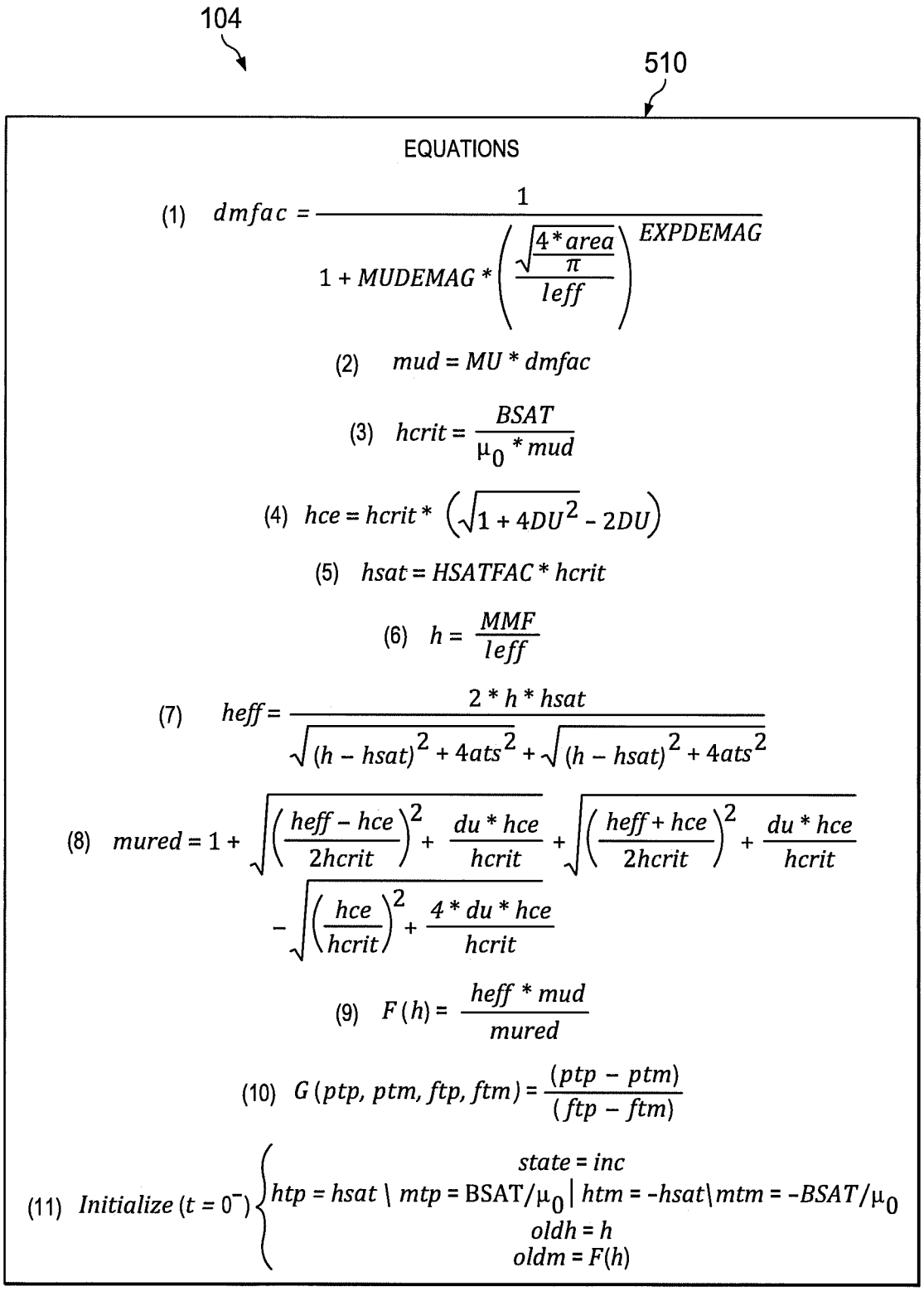

FIGS. 6A and 6B illustrate a detailed example of magnetically susceptible core model equations 510 in the magnetic core model 104 of FIG. 5. In this embodiment, the core model 104 is executable by the processor 302 to simulate operation of the magnetically susceptible core 204 by computing an effective permeability $\mu_{eff}$ of the magnetically susceptible core 204 at least partially according to the geometry of the core 204, thereby facilitating improved accuracy in simulation of the fluxgate sensor operation.

As seen below, the illustrated core model 104 includes the following equations 510 (equations (1)-(21)):

$$dmfac = \frac{1}{1 + MUDEMAG * \left(\frac{\sqrt{\frac{4 * area}{\pi}}}{leff}\right)^{EXPDEMAG}} \quad (1)$$

$$mud = MU * dmfac \quad (2)$$

$$hcrit = \frac{BSAT}{\mu_0 * mud} \quad (3)$$

$$hce = hcrit * \left(\sqrt{1 + 4DU^2} - 2DU\right) \quad (4)$$

$$hsat = HSATFAC * hcrit \quad (5)$$

$$h = \frac{MMF}{leff} \quad (6)$$

$$heff = \frac{2 * h * hsat}{\sqrt{(h - hsat)^2 + 4ats^2} + \sqrt{(h + hsat)^2 + 4ats^2}} \quad (7)$$

$$mured = 1 + \sqrt{\left(\frac{heff - hce}{2hcrit}\right)^2 + \frac{du * hce}{hcrit}} + \sqrt{\left(\frac{heff + hce}{2hcrit}\right)^2 + \frac{du * hce}{hcrit}} - \sqrt{\left(\frac{hce}{hcrit}\right)^2 + \frac{4 * du * hce}{hcrit}} \quad (8)$$

$$F(h) = \frac{heff * mud}{mured} \quad (9)$$

$$G(ptp, ptm, ftp, ftm) = \frac{(ptp - ptm)}{(ftp - ftm)} \quad (10)$$

Initialize $(t = 0^-)$ (11)

$$\begin{cases} state = inc \\ htp = hsat \mid mtp = BSAT/\mu_0 \mid htm = -hsat \mid mtm = -BSAT/\mu_0 \\ oldh = h \\ oldm = F(h) \end{cases}$$

if $(h < oldh \, \&\& \, state == inc)$ (12)

$$\begin{cases} htp = oldh \mid mtp = oldm \\ state = dec \\ m = G(mtp, mtm, F(htp - HC), F(htm + HC)) \\ b = mtp - m * F(htp - HC) \\ oldh = h \\ oldm = F(h) \end{cases}$$

if $(h > oldh \, \&\& \, state == dec)$ (13)

$$\begin{cases} htm = oldh \mid mtm = oldm \\ state = inc \\ m = G(mtp, mtm, F(htp - HC), F(htm - HC)) \\ b = mtp - m * F(htp - HC) \\ oldh = h \\ oldm = F(h) \end{cases}$$

if $(h < htm \, \&\& \, state == dec)$ (14)

$$\begin{cases} htm = -hsat \mid mtm = -BSAT/\mu_0 \\ m = G(mtp, mtm, F(htp + HC), F(htm + HC)) \\ b = mtp - m * F(htp + HC) \end{cases}$$

if $(h > htp \, \&\& \, state == inc)$ (15)

$$\begin{cases} htp = hsat \mid mtp = BSAT/\mu_0 \\ m = G(mtp, mtm, F(htp - HC), F(htm - HC)) \\ b = mtp - m * F(htp - HC) \end{cases}$$

if $(h > oldh \, \&\& \, state == inc)\{oldh = h \mid oldm = F(h)\}$ (16)

if $(h < oldh \, \&\& \, state == dec)\{oldh = h \mid oldm = F(h)\}$ (17)

if $(state == inc)\{mags = m * F(h - HC) + b\}$ (18)

if $(state == dec)\{mags = m * F(h + HC) + b\}$ (19)

$$magd = \frac{OMEGAN}{DAMPFAC} * \frac{\left(s + \frac{OMEGAN}{DAMPFA}\right)}{\left(s^2 + \frac{OMEGAN}{DAMPFAC} * s + OMEGAN^2\right)} * mags \quad (20)$$

$$PHI = B * area = \mu_0 * magd * area \quad (21)$$

In this embodiment, the model parameters 504 and the equations (1) and (2) in FIG. 6A provide modeling for the demagnetization factor and demagnetization aspects of the core 204 based at least in part on the core geometry. Accordingly, the core model 104 provides scalability with respect to core geometry, as described further below in connection with FIGS. 11 and 12. In addition, equations (3)-(9) in FIG. 6A provide a model for the B-H curve at least partially based on the user defined geometry aspects of the magnetically susceptible core, with improvements for the simulated transitions between the linear and saturation curve portions as described further in connection with FIG. 8 below. As seen in FIG. 6A, for instance, the equations (3)-(9) involve the effective core area through the computation of equation (1) in computing the mud variable in equation (2), which is used in equation (9). Moreover, equations (10)-(19) model hysteresis behavior of the modeled core 204, as described further in connection with FIGS. 9 and 10 below, and equation (20) models frequency dependence. Moreover, these advantages provided by the core model 104 are also realized with respect to modeling of other magnetic components, including without limitation the transformer of FIGS. 17 and 18 as well as the inductor device described below in connection with FIGS. 19 and 20.

FIG. 7 shows an example external magnetic field model 108 in the fluxgate sensor component simulation model 100 of FIG. 1, and provides inputs 700 including translation of electrical current source input to the magnetic flux density domain as well as a core length geometric input, along with an ambient relative permeability model parameter 702, an MMF value output, as well as a free space permeability physical constant 706 and an MMF equation 708 solved during simulation to provide the MMF output.

Referring now to FIGS. 8-12, the user adjustable magnetic component model 100 provides improved accuracy in B-H curve modeling and inductance versus current modeling, and also models the demagnetization factor with respect to geometric scaling by operation of the core model(s) 104. In addition, the model 100 in certain embodiments provides hysteresis simulation, and facilitates improved simulation convergence when used in a simulation system 300. The disclosed models 100 provide a new approach to simulate external magnetic field effects on a fluxgate magnetic sensor 202, as well as improvements in modeling many forms of magnetic components. With respect to fluxgate sensors 202, moreover, the model 100 enables designers to simulate the response of the sensor 202 to an external magnetic field using a standard circuit simulator application 308, and provides a fluxgate macro model supporting scalability with respect to various geometric factors including the magnetic core width, length, the number of coils, coil widths, coil spacing, etc. Moreover, the modeling systems and techniques of the present disclosure provide for simulation of various fluxgate sensor configurations, such as differential models 100 (FIGS. 1 and 13) and/or single ended sensors (e.g., FIG. 15), thereby allowing designers to simulate and optimize integrated fluxgate performance with the surrounding circuitry.

FIG. 8 shows a graph 800 illustrating a B-H curve 802, wherein equations (3)-(9) above provide an accurate curve 802 particularly in the transition regions 806 between the linear slope region and the outlying saturation regions at least partially according to the user defined core geometry. As shown in the graph 800, moreover, the modeling 802 provided by the disclosed core model 104 (e.g., equations (3)-(9)) provides a closer fit to actual measured response, and hence improved simulation accuracy relative to prior modeling result curve 804 (shown in dotted line in FIG. 8) obtained using a hyperbolic tangent function.

FIG. 9 provides a graph 900 showing hysteresis modeling of the B-H curve 902 obtained using the model 100, including the demagnetization effects modeled for accurate simulation by the above equations (10)-(19). As seen in the graph 900, a first curve portion 902a for decreasing H values shows corresponding decrease in the resulting B value at a rate or curve slope computed based at least partially on the geometry aspects of a given design, eventually transitioning to a negative saturation level. Thereafter, application of positive H values leads to increasing resultant B values along a different second curve portion 902b, eventually transitioning to a positive or upper saturation level.

Figure 10:
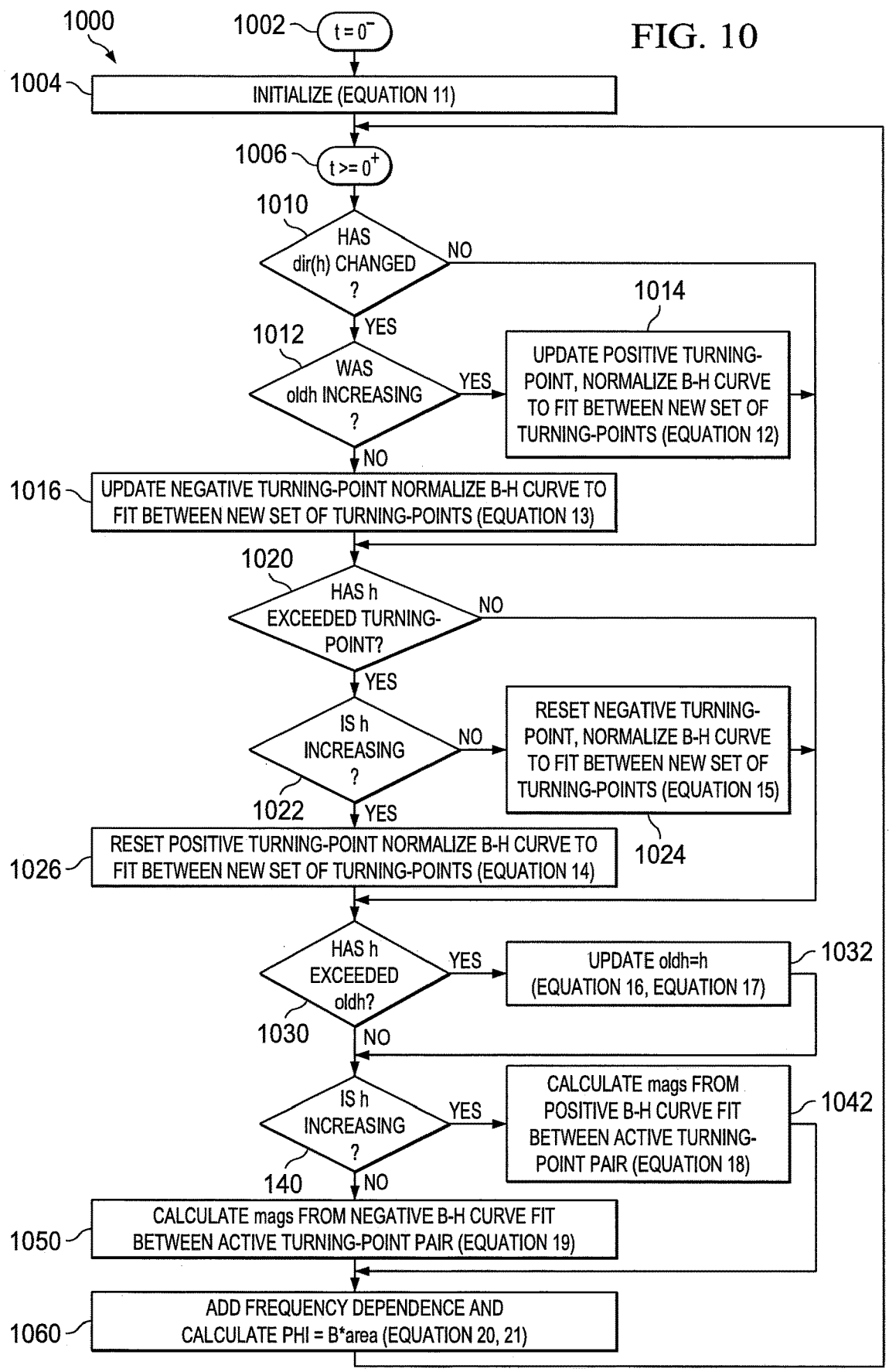
FIG. 10 is a flow diagram illustrating implementation of the B-H curve hysteresis in the magnetically susceptible core model of FIGS. 5-6B.

FIG. 10 provides a flow diagram 1000 beginning at an initial time at 1002 for simulating the B-H curve hysteresis in the magnetically susceptible core model 104 of FIGS. 5-6B. The process 1000 is initialized via equation (11) at 1004 and a time value is incremented at 1006, with a determination being made at 1010 as to whether the H direction has changed. If so (Y at 1010), a determination is made at 1012 as to whether the previous H value is also increasing. If so (Y at 1012), the model 104 updates a positive turning point variable and normalizes the B-H curve to fit between a new set of turning points per equation (12) at 1014. If the previous H value was not increasing (N at 1012), a negative turning point is updated and the B-H curve is normalized at 1016 to fit between the new set of turning points per equation (13). In either case, the process 1000 proceeds to 1020 where a determination is made as to whether the current H value has exceeded the turning point, and if so (Y at 1020), a determination is made at 1022 as to whether H is increasing. If not (N at 1022), a negative turning point is reset and the B-H curve is normalized at 1024 in order to fit between a new set of turning points per equation (15), and otherwise (Y at 1022), a positive turning point is reset at 1026 and the B-H curve is normalized to fit between a new set of turning points per equation (14).

The process 1000 then proceeds to 1030 for determination of whether H has exceeded the previous H value, and if so (Y at 1030) a previous H variable "oldh" is updated to the current H value per equations (16) and (17) at 1032, and a determination is made at 1040 as to whether H is increasing. If so (Y at 1040), the model 104 calculates a "mags" variable per equation (18) at 1042 from a positive B-H curve fit between an active turning point pair, and otherwise (N at 1040) the mags variable is calculated at 1050 from a negative B-H curve fit between the active turning point pair per equation (19). Thereafter, frequency dependence is added at 1060 and the magnetic flux value "PHI" is calculated based on the magnetic flux density "B" and the magnetically susceptible core area per equations (20) and (21), with the process 1000 returning to increment the time variable at 1006 and proceeding again as described above.

Figure 11:
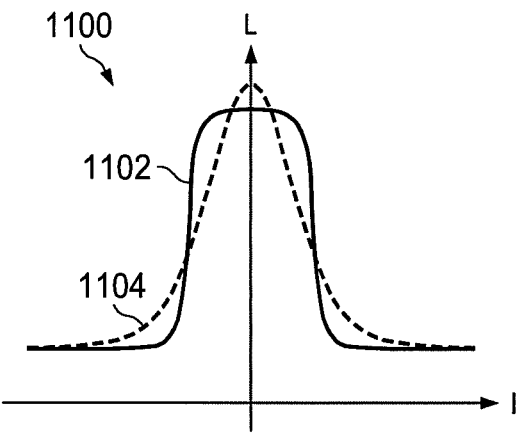
FIG. 11 is a graph illustrating an inductance vs. current curve simulated by the magnetically susceptible core model of FIGS. 5-6B.
Figure 12:
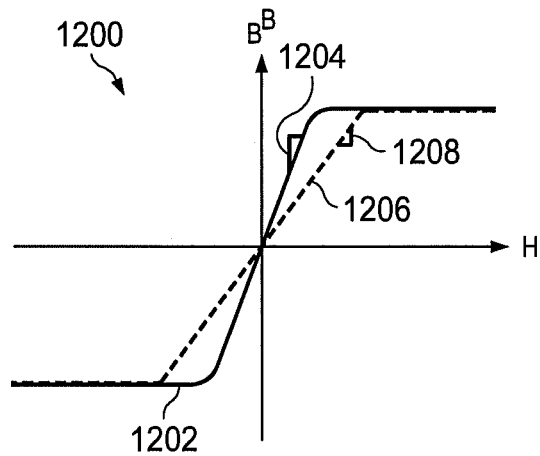
FIG. 12 is a graph illustrating the scaling of the B-H curve simulated by the magnetically susceptible core model of FIGS. 5-6B with changes in core geometry.

Referring also to FIGS. 11 and 12, FIG. 11 shows a graph 1100 illustrating an inductance vs. current curve 1102 simulated by the core model 104 of FIGS. 5-6B, including a relatively flat plateau in the region around low or zero current levels. This is in contrast to the dotted line curve 1104 obtained using previous modeling techniques based on a hyperbolic tangent function, where the curve 1102 achieved by the disclosed core model 104 corresponds more closely to actual measured data and thus provides improved simulation accuracy and convergence based on employment of the geometry aspects of the modeled core 204 according to user inputs.

FIG. 12 provides a graph 1200 illustrating the scaling of the B-H curves 1202, 1206 simulated by the core model 104 of FIGS. 5-6B with changes in magnetically susceptible core geometry. In particular, the first simulated B-H curve 1202 has a relatively steep slope 1204 in the linear region corresponding to a simulated relatively long core length L (e.g., 1000 μm in one example), while the second simulated curve 1206 has a lower slope 1208 for a simulated core of approximately half that length (e.g., 500 μm). It will be appreciated that the effective permeability of the ferromagnetic or other magnetically susceptible core 204 emulated by the simulation model component 104 generally corresponds to the linear region slope 1206, 1208, and thus the incorporation and employment of the user-adjustable geometry aspects in the core model 104 advantageously enhances the simulation accuracy of a given design with respect to B-H curve performance.

The present disclosure also contemplates methods for simulating a magnetic circuit component 202, which may be implemented in the above-described system 300 in one example. In these methods, a modeled electrical circuit 200 is provided via a user interconnection of two or more circuit component models (e.g., models 310 in FIG. 3) including at least one modeled magnetic circuit component model 100, and one or more user configurable parameters are received by the system 300 to define at least one geometry aspect (e.g., length, width, thickness, area, shape, etc.) of a magnetically susceptible core 204 of the modeled component 202. Using one or more processors (e.g., processor 302 in FIG. 3 above) at least one core model 104 is executed to simulate operation of the modeled core 204 based at least in part on the core geometry aspect(s), and at least one coil model (e.g., 106 above) is executed by the processor to simulate operation of a coil 206 wound at least partially around the core 204.

Referring now to FIGS. 13 and 14, FIG. 13 illustrates another differential fluxgate magnetic sensor component simulation model 100 without compensation coils, and FIG. 14 shows a corresponding user interface rendering of the fluxgate sensor simulation model of FIG. 13. In this case, the differential configuration is modeled using first and second series magnetic circuits connected in parallel with one another in the magnetic domain, with the coil, external field and core model components 106, 102 and 104 being connected in series with one another via the magnetic domain positive and negative MP and MN, and electric domain connections being coupled to one another and to corresponding predetermined connection inputs 102 as shown. In this case, the model 104 generally corresponds to the modeled differential fluxgate sensor 202 shown in FIG. 2 above, except that the compensation coils 206c and connected compensation circuit 218 are omitted.

Figure 16:
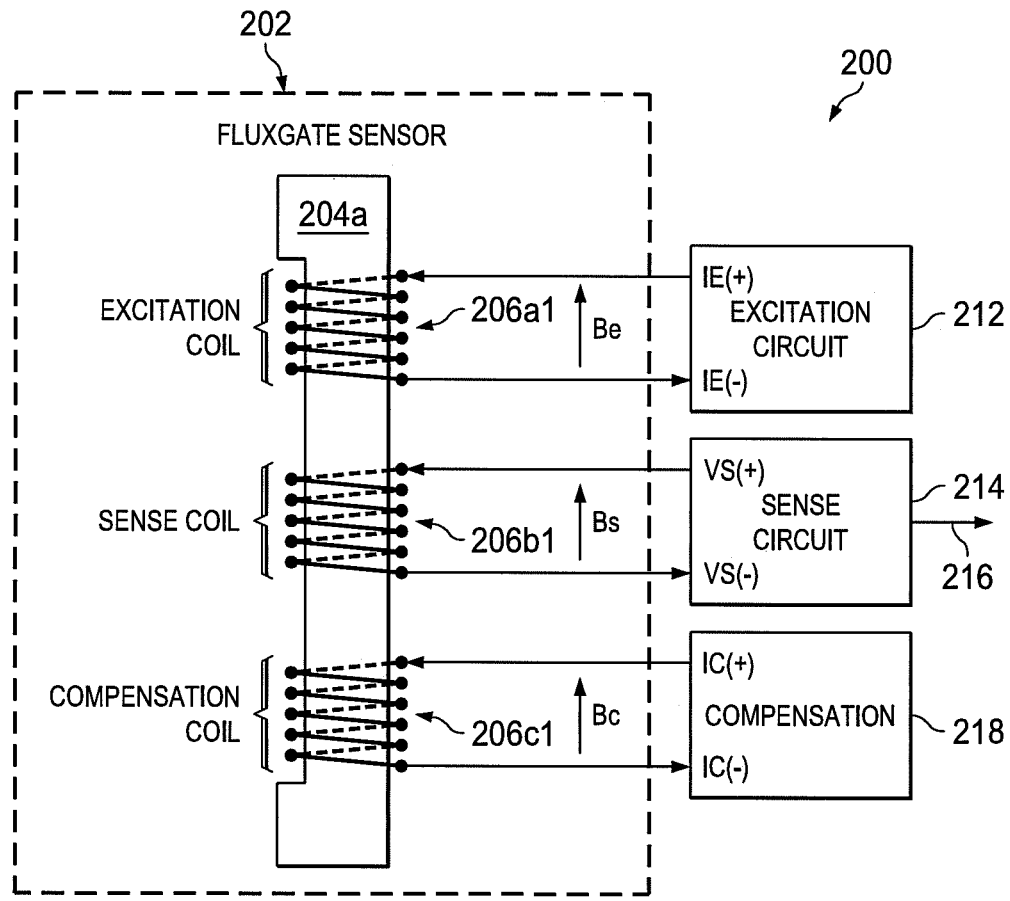
FIG. 16 is a schematic diagram illustrating a single ended fluxgate magnetic sensor simulated by the model of FIG. 15 connected with excitation, sensing and compensation circuit components.
Figure 17:
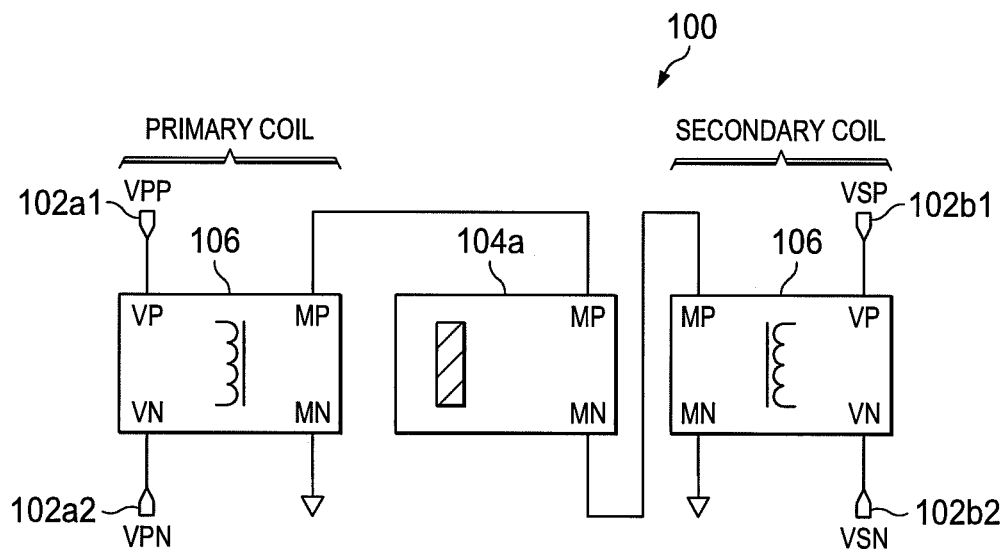
FIG. 17 is a schematic diagram illustrating a transformer magnetic component model.

Referring now to FIGS. 15 and 16, FIG. 15 shows a single ended fluxgate magnetic sensor component simulation model embodiment 100 providing a single series magnetic circuit including an excitation coil model 106a1, a magnetic field model 108a, a sense coil model 106b1, an optional compensation coil model 106c1, and a single core model 104a. In addition, FIG. 16 shows a circuit configuration 200 with a single ended fluxgate sensor embodiment 202 modeled by the model 100 of FIG. 15. As seen in FIG. 16, the core structure 204 includes a core portion 204a with an excitation coil 206a1, a sense coil 206b1 and an optional compensation coil 206c1 wound at least partially around a first course portion 204a and respectively interconnected with an excitation circuit 212, a sense circuit 214 and a compensation circuit 218 generally as described above.

Figure 18:
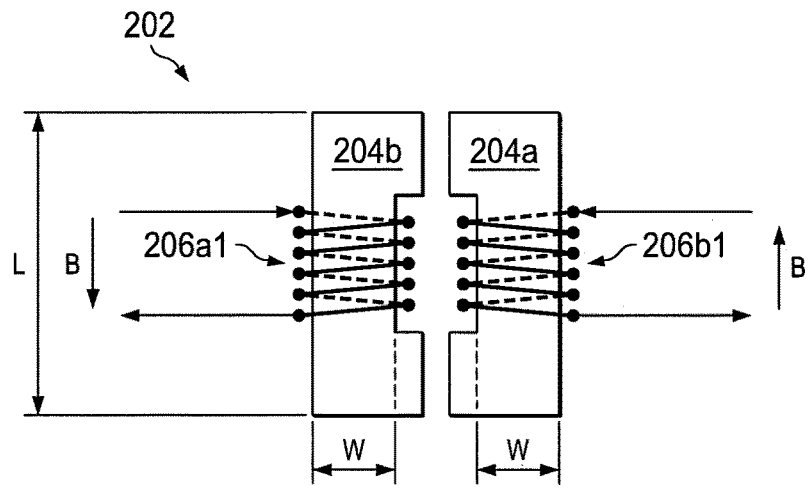
FIG. 18 is a schematic diagram illustrating a transformer simulated by the model of FIG. 17.
Figure 19:
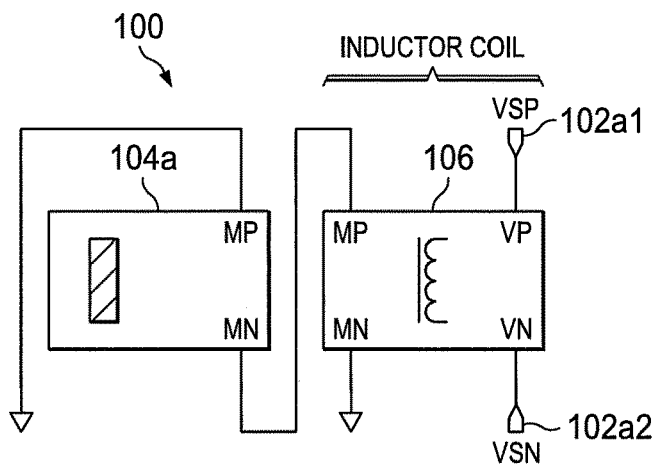
FIG. 19 is a schematic diagram illustrating an inductor magnetic component model.

Referring now to FIGS. 17 and 18, FIG. 17 shows a transformer magnetic component model 100, in this case without any compensation coil model 106c and without any external magnetic field model 108, together with a corresponding modeled transformer magnetic component 202 is shown in FIG. 18 having first and second core portions 204a and 204b. In this example, the transformer 202 includes a primary winding or coil 206a1 wound around the core portion 204b and modeled in FIG. 17 via a primary coil model 106 with a electric domain input VP connected to a positive primary voltage connection input 102a1 (VPP), and a negative electric domain input VN connected to a negative primary voltage connection input 102a2 (VPN). The transformer 202 also includes a secondary coil 206b1 wound around the core portion 204a, which is modeled in FIG. 17 by a secondary coil model 106 with electrical domain connections to positive and negative connection inputs 102b1 (VSP) and 102b2 (VSN). As seen in FIG. 17, the magnetic component model 100 for the illustrated transformer 202 provides for series connection of the primary coil model 106, a core model 104a as previously described, and the secondary coil model 106 in series with one another to form a magnetic circuit, with the negative magnetic domain connections MN of the coil models 106 being connected to a simulation circuit ground. As with the fluxgate sensor models 100 described above, the incorporation of the geometric aspects of the core 204 in the core model 104 advantageously enhances simulation accuracy with respect to the transformer component 202. Moreover, the model 100 may be modified in other embodiments to incorporate an external magnetic field model 108 as previously described, for example, connected in the magnetic domain in series with the model components shown in FIG. 17, in order to simulate performance of the transformer 202 in the presence of a proximate magnetic field.

Figure 20:
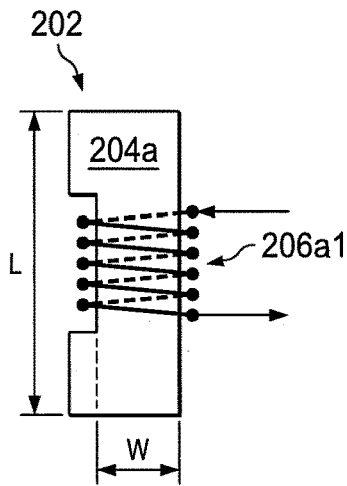
FIG. 20 is a schematic diagram illustrating an inductor simulated by the model of FIG. 19.

Referring also to FIGS. 19 and 20, an inductor magnetic component model 100 is shown in FIG. 19, and FIG. 20 shows a corresponding inductor 20 simulated by the model of FIG. 19. In this case, a core model 104a and a single inductor coil model 106 are connected in a series magnetic circuit in the magnetic component model 100 of FIG. 19 to model operation of the inductor 202 in a simulated circuit. In other embodiments, the model 100 may be modified to incorporate an external magnetic field model 108 as previously described, for example, to simulate performance of the inductor 202 in the presence of a proximate magnetic field.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A user adjustable magnetic component model stored in a non-transitory computer readable medium and executed by a processor to simulate operation of a modeled magnetic circuit component in a modeled electrical circuit, the magnetic component model comprising:

a set of predetermined connection inputs that include simulated circuit connections to the modeled magnetic circuit component;

a model user input including a user configurable parameter having a geometry aspect of a magnetically susceptible core of the modeled magnetic circuit component, the magnetically susceptible core including two core portions;

a core model executed by the processor to simulate operation of the magnetically susceptible core of the modeled magnetic circuit component at least partially according to the geometry aspect of the magnetically susceptible core; and a coil model executed by the processor to simulate operation of a coil wound at least partially around the magnetically susceptible core of the modeled magnetic circuit component;

wherein the magnetic component model simulates operation of a modeled magnetic sensor and comprises:

an excitation coil model executable by the processor to simulate operation of an excitation coil wound at least partially around the magnetically susceptible core of the modeled magnetic circuit component at least partially according to a simulated circuit connection to a simulated excitation circuit;

a sense coil model executable by the processor to simulate operation of a sense coil wound at least partially around the magnetically susceptible core of the modeled magnetic circuit component at least partially according to a simulated circuit connection to a simulated sense circuit; and a magnetic field model executable by the processor to simulate operation of an external magnetic field proximate the magnetically susceptible core of the modeled magnetic circuit component;

wherein the core model, the excitation coil model, the sense coil model, and the magnetic field model are connected in a series magnetic circuit in the magnetic component model; and wherein the core model is executable by the processor to simulate operation of the magnetically susceptible core at least partially according to the simulated external magnetic field.

2. The magnetic component model of claim 1, wherein the magnetic component model comprises:

a compensation coil model executable by the processor to simulate operation of a compensation coil wound at least partially around the magnetically susceptible core of the modeled magnetic circuit component at least partially according to a simulated circuit connection to a simulated compensation circuit;

wherein the core model, the excitation coil model, the sense coil model, the magnetic field model, and the compensation coil model are connected in the series magnetic circuit in the magnetic component model.

3. The magnetic component model of claim 2, wherein the magnetic component model simulates operation of a modeled differential magnetic sensor and comprises:

a first series magnetic circuit including a first core model, a first excitation coil model, a first sense coil model, a first magnetic field model, and a first compensation coil model; and a second series magnetic circuit including a second core model, a second excitation coil model, a second sense coil model, a second magnetic field model, and a second compensation coil model; and wherein the first and second series magnetic circuits are coupled in parallel with one another in the magnetic component model.

4. The magnetic component model of claim 1, wherein the magnetic component model simulates operation of a modeled differential magnetic sensor and comprises:

a first series magnetic circuit including a first core model, a first excitation coil model, a first sense coil model, and a first magnetic field model; and a second series magnetic circuit including a second core model, a second excitation coil model, a second sense coil model, and a second magnetic field model; and wherein the first and second series magnetic circuits are coupled in parallel with one another in the magnetic component model.

5. The magnetic component model of claim 1, wherein the core model is executable by the processor to simulate operation of the magnetically susceptible core by computing an effective permeability of the magnetically susceptible core at least partially according to the geometry aspect of the magnetically susceptible core, and to simulate a magnetic flux density versus magnetic field characteristic curve (B-H curve) linear-to-saturation region transition of the magnetically susceptible core at least partially according to the geometry aspect of the magnetically susceptible core.

6. A circuit simulation system, comprising:

a processor;

an electronic memory operatively coupled with the processor;

a user adjustable magnetic component model stored in the electronic memory and executed by the processor to simulate operation of a modeled magnetic circuit component in a modeled electrical circuit, the magnetic component model comprising:

a set of predetermined connection inputs that include simulated circuit connections to the modeled magnetic circuit component, a model user input stored in the electronic memory and including a user configurable parameter having a geometry aspect of a magnetically susceptible core of the modeled magnetic circuit component, the magnetically susceptible core including two core portions, a core model stored in the electronic memory and executed by the processor to simulate operation of the magnetically susceptible core of the modeled magnetic circuit component at least partially according to the geometry aspect of the magnetically susceptible core, and a coil model stored in the electronic memory and executed by the processor to simulate operation of a coil wound at least partially around the magnetically susceptible core of the modeled magnetic circuit component; and a simulator implemented using the processor and operative to simulate operation of the modeled electrical circuit at least partially according to the magnetic component model;

wherein the magnetic component model simulates operation of a modeled magnetic sensor and comprises:

an excitation coil model stored in the electronic memory and executable by the processor to simulate operation of an excitation coil wound at least partially around the magnetically susceptible core of the modeled magnetic circuit component at least partially according to a simulated circuit connection to a simulated excitation circuit;

a sense coil model stored in the electronic memory and executable by the processor to simulate operation of a sense coil wound at least partially around the magnetically susceptible core of the modeled magnetic circuit component at least partially according to a simulated circuit connection to a simulated sense circuit; and a magnetic field model stored in the electronic memory and executable by the processor to simulate operation of an external magnetic field proximate the magnetically susceptible core of the modeled magnetic circuit component;

wherein the core model, the excitation coil model, the sense coil model, and the magnetic field model are connected in a series magnetic circuit in the magnetic component model; and wherein the core model is executable by the processor to simulate operation of the magnetically susceptible core at least partially according to the simulated external magnetic field.

7. The circuit simulation system of claim 6, wherein the magnetic component model comprises:

a compensation coil model stored in the electronic memory and executable by the processor to simulate operation of a compensation coil wound at least partially around the magnetically susceptible core of the modeled magnetic circuit component at least partially according to a simulated circuit connection to a simulated compensation circuit;

wherein the core model, the excitation coil model, the sense coil model, the magnetic field model, and the compensation coil model are connected in the series magnetic circuit in the magnetic component model.

8. The circuit simulation system of claim 7, wherein the magnetic component model simulates operation of a modeled differential magnetic sensor and comprises:

a first series magnetic circuit including a first core model, a first excitation coil model, a first sense coil model, a first magnetic field model, and a first compensation coil model; and a second series magnetic circuit including a second core model, a second excitation coil model, a second sense coil model, a second magnetic field model, and a second compensation coil model; and wherein the first and second series magnetic circuits are coupled in parallel with one another in the magnetic component model.

9. The circuit simulation system of claim 6, wherein the magnetic component model simulates operation of a modeled differential magnetic sensor and comprises:
- a first series magnetic circuit including a first core model, a first excitation coil model, a first sense coil model, and a first magnetic field model; and
- a second series magnetic circuit including a second core model, a second excitation coil model, a second sense coil model, and a second magnetic field model; and
- wherein the first and second series magnetic circuits are coupled in parallel with one another in the magnetic component model.

* * * * *